(12) United States Patent
Muller et al.

(10) Patent No.: US 7,304,352 B2
(45) Date of Patent: Dec. 4, 2007

(54) ALIGNMENT INSENSITIVE D-CACHE CELL

(75) Inventors: K. Paul Muller, Wappingers Falls, NY (US); Kevin A. Batson, Williston, VT (US); Michael J. Lee, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 24 days.

(21) Appl. No.: 11/111,454

(22) Filed: Apr. 21, 2005

(65) Prior Publication Data

US 2006/0239057 A1    Oct. 26, 2006

(51) Int. Cl.
*H01L 29/76*    (2006.01)
*H01L 29/94*    (2006.01)

(52) U.S. Cl. ............... 257/369; 257/202; 257/903; 257/904; 257/296; 257/300; 257/508; 257/E27.099; 257/E27.101; 257/E21.661; 365/63; 365/154

(58) Field of Classification Search ............ None
See application file for complete search history.

(56) References Cited

U.S. PATENT DOCUMENTS 5,473,574 A    12/1995   Clemen et al.
5,973,986 A    10/1999   Jung
6,661,733 B1  12/2003   Pan et al.
6,737,685 B2   5/2004   Aipperspach et al.
6,744,661 B1 *  6/2004   Shubat ................. 365/156
6,751,151 B2   6/2004   Hsu et al.
2002/0100920 A1 *  8/2002   Yamauchi et al. .......... 257/200
2003/0123279 A1 *  7/2003   Aipperspach et al. ....... 365/154
2004/0075151 A1   4/2004   Fung et al.

* cited by examiner

*Primary Examiner*—Sue A. Purvis
*Assistant Examiner*—Fazli Erdem
(74) *Attorney, Agent, or Firm*—Scully, Scott, Murphy & Presser, P.C.; Jospeh P. Abate, Esq.

(57) ABSTRACT

A D-Cache SRAM cell having a modified design in schematic and layout that exhibits increased symmetry from the circuit schematic and the physical cell layout perspectives. That is, the SRAM cell includes two read ports and minimizes asymmetry by provisioning one read port on a true side and one on the complement side. Asymmetry is additionally minimized in layout as cross coupling on both the true and complement sides rises up one level by providing from the local interconnect level a via connection to a M1 or metallization level. Moreover, the distance between the local interconnect (MC) and the gate conductor structure (PC) has been enlarged and equalized for each of the pFETs in the cross-latched SRAM cell. As a result, the SRAM cell has been rendered insensitive to overlay (local interconnect processing too close) by maximizing this MC-PC distance.

14 Claims, 9 Drawing Sheets

ALIGNMENT INSENSITIVE D-CACHE CELL

BACKGROUND OF THE INVENTION

1. Field of the Invention

The present invention broadly relates to an improvement in the design and structure of SRAM memory cells, and more particularly, it relates to a novel design and layout of a Data-cache (D-cache) cell that is more symmetric and insensitive to lithography alignments during manufacture.

2. Description of the Prior Art

In the field of microprocessor and cache memory designs, particularly, groups of SRAM cells making up a D-cache that is formed in close proximity to the microprocessor and in which speed of access is critical, it has been found that these D-cache cells were very sensitive to alignments—particularly between the transistor gate conductor regions ("PC"), e.g., of the pull-up transistor, and respective local interconnects ("MC") connected to drain/source regions of the transistors, and, further, have asymmetries in both schematic and layout. Consequently, production yield has been very low.

For example, FIG. 1 illustrates a circuit schematic 10 of the prior art D-cache comprising an SRAM cell 12 having a group of six (6) transistors, four of which indicated as P0, P1, N4 and N5 are of a cross-coupled latch configuration of typical SRAM design. As shown in FIG. 1, read and write access to the SRAM cell is accomplished via WBL (true side) and $\overline{\text{WBL}}$ (complement side) the respective bit line and bit line complement and are accessed by controlling respective access transistors N12 and N11 and the word line signal (WLW). In order to perform a very fast read (cache write-through) the SRAM cell design 10 further includes additional transistors N16 and N18 forming a first additional read port, and transistors N15 and N17 forming a second additional read port, both connected to the WBL at the intersection of the SRAM P1 and N5 transistors so that data can be quickly accessed and/or replicated.

As shown in FIG. 1, there is an asymmetry from the schematic perspective as no corresponding read port is provided for connection with the $\overline{\text{WBL}}$ line. This asymmetry is critical as it would be desirable on the complement side ($\overline{\text{WBL}}$ line) comprising transistors P0 and N4 to effortlessly store complementary bit data as it is designed. However, provision of first and second additional read port circuits 14a and 14b comprising read port transistors N16 and N18 provide a leakage path to ground, which has been shown to detrimentally affect operation of the P1 pull-up transistor of the SRAM. In order to keep the cell high on the true side (e.g. logic "1"), P1 has to supply additional currents to overcome the leakage to ground. There is no such leakage path if the complement side is high thus, rendering it harder to maintain a stored "1".

As further shown in FIG. 2(a), with like reference numbers corresponding to like elements depicted in the circuit schematic of FIG. 1, there additionally exists an asymmetry with respect to the physical cell layout. As shown in FIG. 2(a), in the physical cell layout depicted, there is provided active silicon ("RX") area 21 in which the physical read port transistors N15-N17 reside; active RX area 31 in which the SRAM pull-up transistors P0 and P1 reside; and active RX area 41 in which the SRAM transistors N4, N5 and bit line transistors N11, N12 reside. The PC polysilicon gates for transistors N15, N16 are shown as the horizontal areas 22, 32, for example, and the PC polysilicon gates for pull-up transistor P0 and transistor N4 and the PC polysilicon gates for pull-up transistor P1 and transistor N5 are shown as the respective horizontal areas 42, 52 in FIG. 2(a). Areas 22, 32 and 42 are connected. As shown in FIG. 2(a), between arrows depicting a distance 30 between the polysilicon gate edge of P1 and the edge of the L-shaped MC (local interconnect) 23. This distance is the minimum allowable according to current lithography groundrules. It is noted that the corresponding distance between the PC polysilicon gate for pull-up transistor P0 and its local interconnect depicted by irregular shaped region MC 33, is increased due to the presence of a notch or jog that effectively increases the space between upper edge of the PC and the lower edge of the MC.

Referring to FIG. 2(b) there is shown the transistors P0 and P1 and the approximate location of respective wide spacer structures 44, 45 as indicated. The spacer structures may be such as described in commonly-owned, co-pending U.S. patent application Ser. No. 10/277,907 (US Publication No. 2004/0075151). As shown in FIG. 2(b), the P1 spacer 45 cuts into the L-shaped local interconnect 23 while on the other side, the P0 spacer 44 is separated from the jogged area of the interconnect 33 without encroachment of the MC. The consequence of this is as follows: the performance of P1 is substantially weakened due to this smaller distance coupled with the read port transistors loading this transistor. This is a problem illustrated in more detail in FIG. 3, which depicts the pFET structure P1, through a cross-sectional view, including the spacer structure 45. As shown in FIG. 3, the MC is depicted as encroaching the spacer 45 and is not separated from it. This is because underneath the MC is a layer of highly-conductive silicide (e.g., CoSi) formed above the drain/source region. However, it is clear that the left corner of the MC 23 encroaches before the end of the CoSi region, i.e., the MC 23 is etched into the spacer and cuts into the silicon closer than the CoSi is located which is detrimental to the device performance as it is closer to the shallow doped drain/source extensions. That is, it has been found that the MC material 23, such as Tungsten or any conductive metal, for example, combines with the metallic surface formed in the shallow extensions and provides a recombination center for holes. This hole recombination mechanism at the source/drain extensions such as shown in FIG. 3, significantly reduces performance of the pFET P0. This is illustrated in FIG. 4, which depicts the performance of the odd wordlines, i.e., depicted in FIG. 3, that includes the P1 transistor and subsequent odd numbered wordlines, etc. where a substantial number of high percent fails occurs on the odd wordlines (e.g., numbered 1, 3, 5 et seq.) due to the spacer encroachment problem.

Moreover, as shown in FIG. 2(b), a further RX contact asymmetry exists which is depicted by a line 34. This asymmetry is shown by a shortening of the RX region 41b above the N11 transistor as compared to the RX region 41a that is extended at N12.

Thus, in sum, the prior art the transistors for CMOS 10S (90 nm technology on SOI) were optimized for performance in the following way: nFETs received a thin spacer in order to ensure short extension regions and thus lower resistance; pFETs received a wide spacer to allow for high activation anneals in spite of larger boron (B) diffusion. As mentioned, there are six (6) transistors in an SRAM cell: 2 pass gates, 2 pulldowns, and 2 pull-ups, the latter being the pFETs. The multiport cell 10 of FIG. 1 includes additional read or write ports and thus more transistors. In this specific case, there are 4 additional nFETs forming two additional read ports. The additional readports allow for fast read operation after the write operation (write through). This cell was designed with two goals: (1) High performance (fast read/write); and, (2) minimum area consumption. However, symmetry was not considered, neither from the schematic, nor from the layout perspective. The asymmetries in design (layout and schematic) combined with non optimized processing steps (MC etch too deep, too close), leads to substantial yield (and reliability) degradation for this cell, while other cells in the same technology yielded as expected. The mechanism for the yield degradation is understood as a hole recombination caused by the presence of the metallic surface (MC) in the lightly doped drain regions (e.g., FIG. 3).

Moreover, in the prior art designs, as the two pull-op and pull-downs are cross-coupled inverters, on each transistor side (e.g., drain region) the connection went up to one metallization (drain region-MC-CA-M1) and then coming back down on the other side through a CA-MC to another transistor. However, on the other side, the cross-coupling was accomplished by providing a large L-shaped MC interconnect that is flat. Thus, there is an asymmetry as one side goes up to a metallization level (M1 processing) and the other side remains flat at a lower level below.

It would thus be highly desirable to provide a SRAM cell design that addresses the performance and minimum area consumption considerations and, that considers the symmetry aspect in both schematic and layout perspectives.

It would thus be highly desirable to provide a SRAM cell design that is insensitive to overlay or misalignment in processing by maximizing the MC-PC distances.

It would thus be highly desirable to provide a SRAM cell design that addresses the asymmetry problems by accomplishing that both connections on all pull-up and pull-down transistors be connected up to the M1 level.

SUMMARY OF THE INVENTION

Therefore, it is an object of the present invention to provide a D-Cache cell having a modified design in schematic and layout that accomplishes the following:

1) Asymmetry minimized in schematic: One read port on true side and one on the complement side.
2) Asymmetry minimized in layout: (a) Cross coupling goes through MC-CA-M1-CA-MC on both sides, i.e., (b) MC-PC distance for pFETs equalized.
3) Cell made insensitive to overlay (MC processing too close) by maximizing MC-PC distance. For example, in one embodiment the outer MC-PC distance for pFETs increased from about worst case 70 nm, for example, to about 114 nm.

Specifically, according to a first aspect of the invention, there is provided a SRAM cell comprising:
first and second cross-coupled inverter devices;
a bit line connected to the first of the cross-coupled inverter devices through a first access transistor, and a complement bit line connected to the second of the cross-coupled inverter devices through a second access transistor; and,
first read port means connected at an internal node of the first of the cross-coupled inverter devices enabling read access to the cell, and, second read port means connected at an internal node of the second of the cross-coupled inverter devices enabling read access to the complement bitline, wherein increased symmetry exists thereby improving SRAM cell performance.

According to another aspect of the invention, there is provided a D-cache memory device comprising: first and second cross-coupled inverter devices defining a respective true bitline node and complement bitline node, the first cross-coupled inverter device including a first pull-up pFET transistor device comprising of a gate conductor structure and a drain and source region upon one of which a first conductive interconnect layer is formed in a semiconductor structure, and the second cross-coupled inverter device includes a second pull-up pFET transistor device comprising a gate conductor structure and a drain and source region upon one of which a second conductive interconnect layer is formed in the semiconductor structure, wherein a distance between the gate conductor structure of the first pull-up pFET transistor device and the first conductive interconnect layer is substantially equal to the distance between the gate conductor structure of the second pull-up pFET transistor device and the second conductive interconnect layer, wherein increased symmetry exists thereby improving D-cache memory device performance.

Further to this other aspect of the invention, the distance between the gate conductor of the first pull-up pFET transistor device and the first conductive interconnect layer and, the distance between the gate conductor of the second pull-up pFET transistor device and the second conductive interconnect layer is maximized, and thus desensitized to lithographic misalignment between gate conductor and interconnect layer.

Moreover, according to this other aspect of the invention, the cross-coupling of the first cross-coupled inverter devices comprises a connection formed at the first conductive interconnect layer through a first via connection to a metal structure formed at a metallization level lying above the first conductive interconnect layer and from the metal structure formed at a metallization level down through a second via connection connecting the gate conductor structure of the second pull-up pFET transistor device.

Likewise, the cross-coupling of the second cross-coupled inverter devices comprises a connection formed at the second conductive interconnect layer through a first via connection to a metal structure formed at a metallization level above the second conductive interconnect layer and from the metal structure formed at a metallization level down through a second via connection connecting the gate conductor structure of the first pull-up pFET transistor device.

Additionally, according to this other aspect of the invention, there is provided a bit line coupled to the true bitline node of the first cross-coupled inverter device through a first access transistor; and, a complement bit line coupled to the complement bitline node of the second cross-coupled inverter device through a second access transistor.

BRIEF DESCRIPTION OF THE DRAWINGS

The present invention will now be described in more detail by referring to the drawings that accompany the present application. It is noted that in the accompanying drawings like reference numerals are used for describing like and corresponding elements thereof.

DETAILED DESCRIPTION OF THE INVENTION

In the description, the following referred to terms will have the following associated meanings: MC is a local interconnect layer in 90 nm, or like, CMOS semiconductor technology which may be Tungsten and is used for contacting metallization lines or contact at low levels; PC is a transistor gate conductor region, e.g., a gate conductor layer comprising any conductive material, such as doped polysilicon; RX is the active silicon area or level where devices are formed, e.g., may comprise Silicon on Insulator (SOI); and, CA are contact vias that are formed to land on an MC local interconnect and represent a connection up to a M1 or metallization level.

Figure 1:
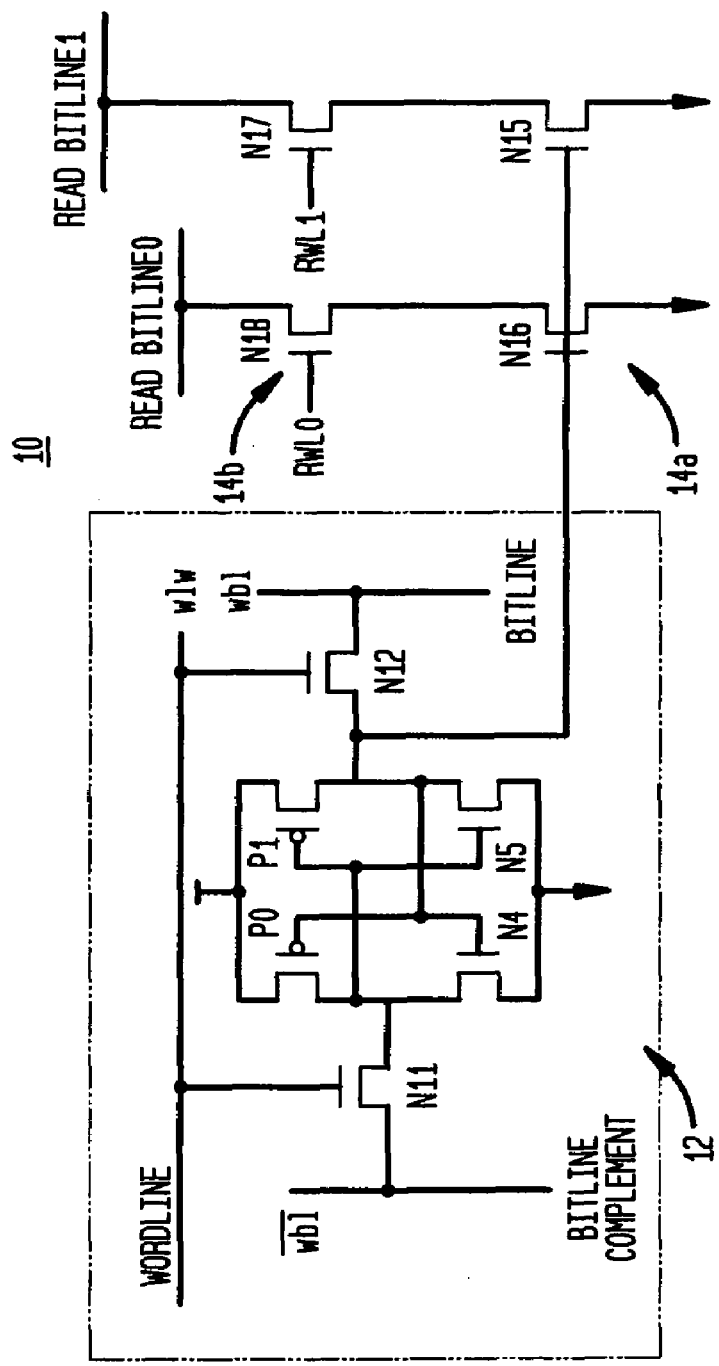
FIG. 1 illustrates a circuit schematic 10 of the prior art D-cache comprising an SRAM cell 12.
Figure 5:
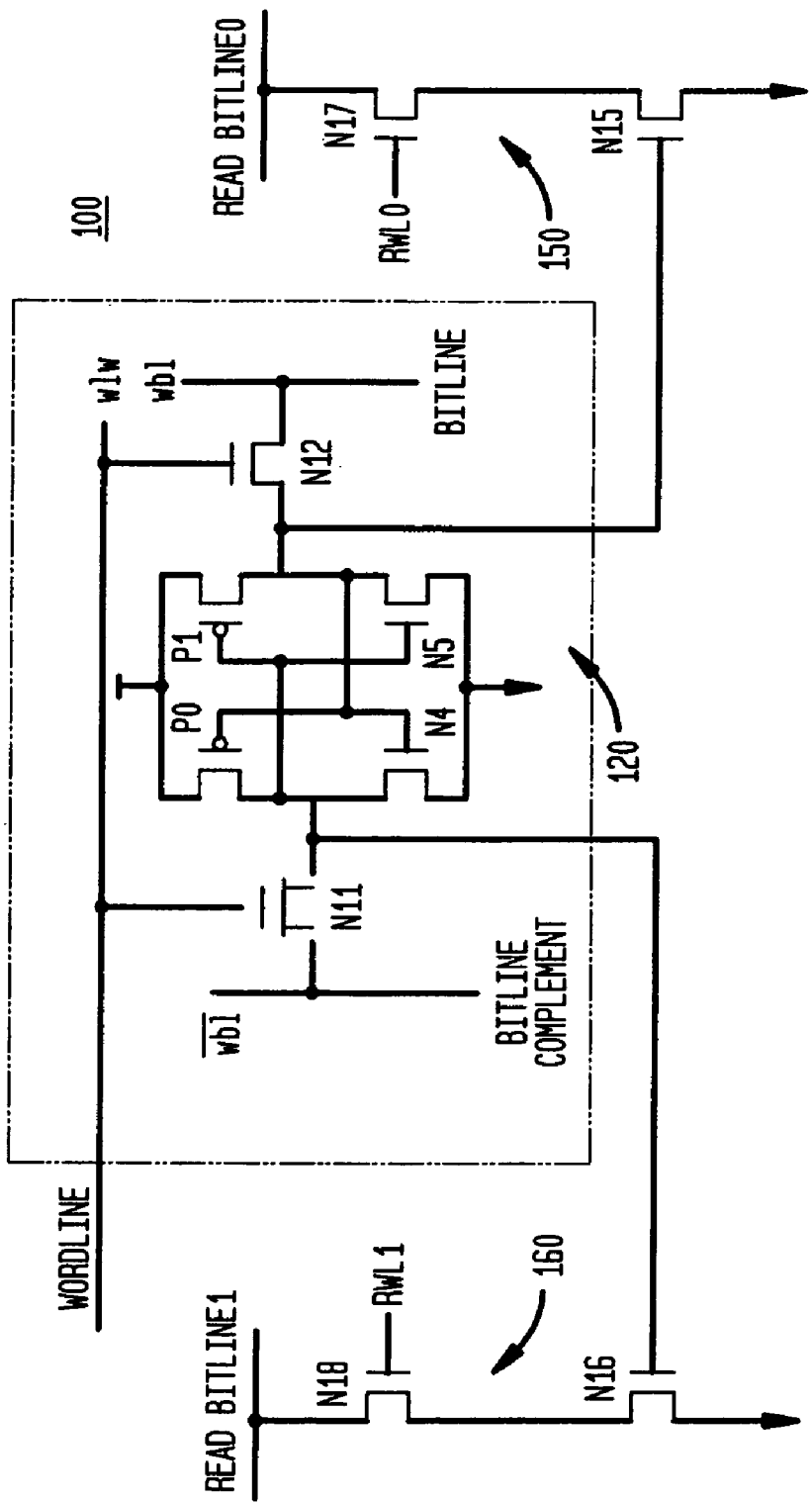
FIG. 5 depicts a new circuit schematic of a D-cache SRAM cell 100 according to the present invention.

FIG. 5 depicts a circuit schematic of a D-cache SPAM cell 100 according to the present invention. As shown in FIG. 5, the modified SPAM Cell design 100 includes the 6T SRAM cell 120 as in the prior art, however, includes a readport 150 on the internal node of the cross-coupled latch configuration of the bitline "true" side and a readport 160 on the internal node of the cross-coupled latch configuration on the bitline complement side. Particularly, as compared with the prior art SPAM cell design 10 of FIG. 1, the circuit layout for the SRAM cell 120 includes the group of six (6) transistors, four of which indicated as P0, P1, N4 and N5 from a cross-coupled latch configuration of typical SRAM design. Such semiconductor structures include pFETs P0, P1 and nFETs N4, N5 and requisite spacer structures can be manufactured, for example, according to techniques such as described in commonly-owned, co-pending U.S. patent application Ser. No. 10/277,907 (US Publication No. 2004/0075151).

As shown in FIG. 5, reading and write access to the SRAM cell 120 is accomplished via WBL and $\overline{\text{WBL}}$ the respective bit line and bit line complement and are accessed by controlling respective access transistors N12 and N11 and the word line signal (WLW). In order to perform a very fast read (cache write-through) the SRAM cell design 100 further includes additional transistors N15 and N17 forming the read port connected to the WBL at the intersection of the SRAM P1 and N5 transistors so that data can be quickly accessed and/or replicated. The SRAM cell design 100 further includes additional transistors N16 and N18 forming the read port 160 connected to the $\overline{\text{WBL}}$ at the intersection of the SRAM P0 and N4 transistors so that data can be quickly accessed and/or replicated.

As shown in FIG. 5, the SRAM cell design 100 minimizes the asymmetry from the schematic perspective as corresponding read ports are provided for connection with each of the WBL and $\overline{\text{WBL}}$ lines.

Figure 6:
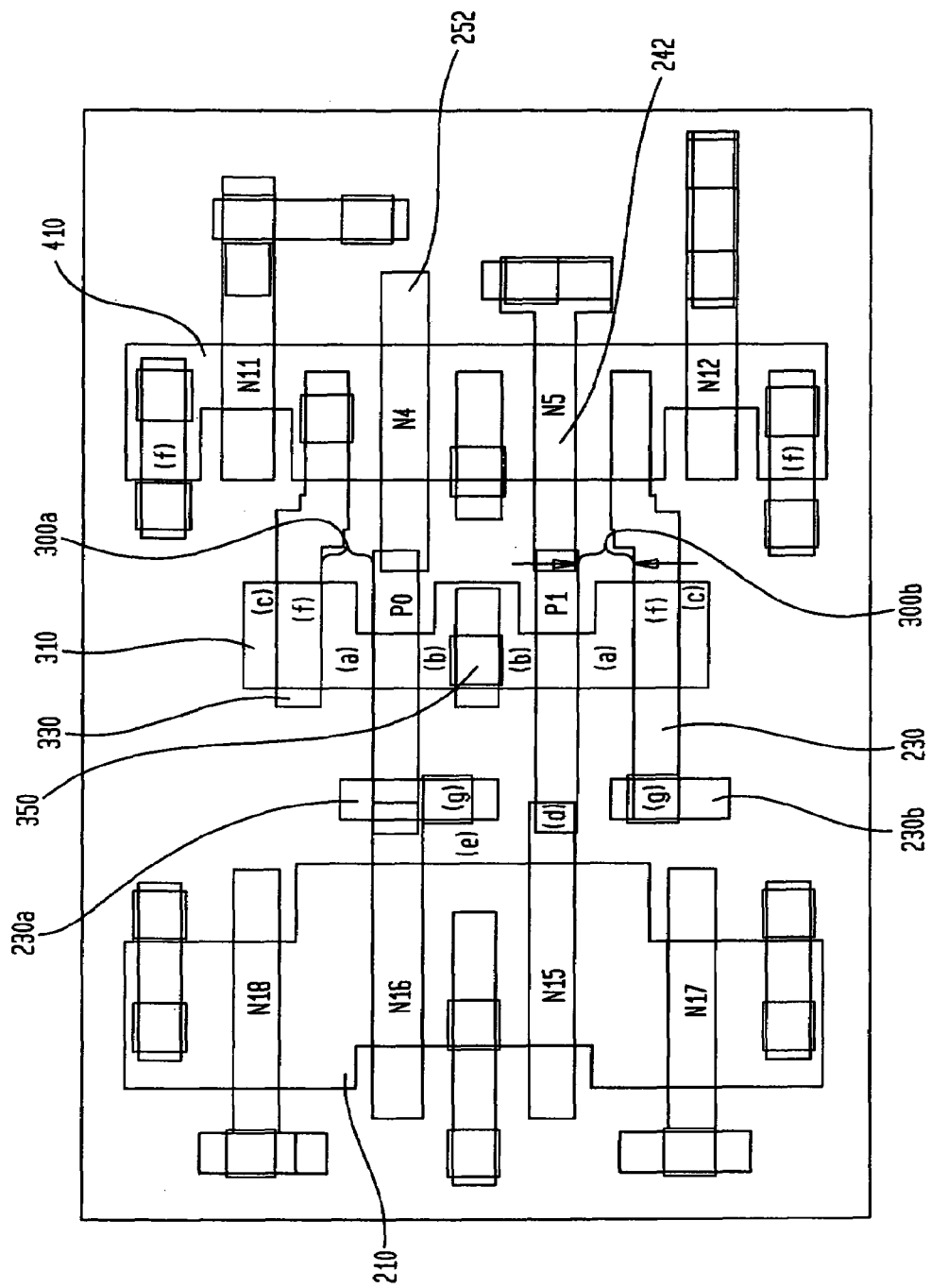
FIG. 6 depicts a schematic and layout capture of the D-cache SRAM cell design according to the invention.

FIG. 6 depicts a layout capture of the D-cache SRAM cell design corresponding to the SRAM cell design circuit schematic 100 as shown in FIG. 5. As shown in FIG. 6, islands 210, 310 and 410 indicate the active area (RX) which may comprise monocrystalline silicon, silicon-on-insulators (SOI), or SiC-on-insulator (SiCOI) or silicon germanium-on-insulators (SGOI) prepared in accordance with conventional SOI fabrication techniques. It is understood that between the active RX islands resides shallow trench isolation (STI) fill comprising dielectric materials such as an oxide, nitride, oxynitride or like materials formed in accordance with conventional STI fabrication techniques. Horizontally extending areas, such as areas 242, 252, represent the PC gate conductor regions, with region 242 indicating transistors N15, P1, N5 and region 252 indicating transistors N16, P0, N4 in accordance with the schematic of FIG. 5. Regions 230, 330 indicate MC regions, i.e., local interconnects, formed of a metal such as copper, aluminum, tungsten, or like conductive material. The square regions, such as region 350 indicated in FIG. 6, represent CA or contact vias that are formed to land on an MC local interconnect and represent the connection up to a M1 or metallization level. As known, these contact vias may include steps such as patterning and RIE etching according to well-known damascene or dual damascene process techniques and may initially include the deposition of a thin refractory metal liner, e.g., on the sidewalls and bottom of an etched via (contact) opening. The refractory metal liner may comprise a refractory material, e.g., tantalum, tantalum nitride, chromium/chromium oxide, titanium, titanium nitride, tungsten, or the like, deposited using any of the known deposition methods, such as, for example, CVD, Atomic Layer deposition, hollow cathode magnetron sputtering, deposit-etch (dep.-etch) process, or any combination of these or, other similar methods. Further, as known to skilled artisans, subsequent to the formation of the liner is the deposition of a contact "plug" (usually by chemical vapor deposition or electroplating) of conductive material, e.g., Copper or Tungsten (or alloys thereof).

According to the layout depicted in FIG. 6, symmetry is improved, particularly between the MC-PC. For instance, the outer MC-PC distance for both pFETs P0 and P1 is increased. That is as shown in FIG. 6, the MC-PC distance was made symmetrical as a result of providing a bend or jog at the MC 230, as indicated by the arrows, resulting in an increase in the outer MC-PC distance, labeled "a", and an increase in the inner MC-PC distance, labeled "b", for both pFETS P0, P1. Thus, as indicated in FIG. 6, PC-MC distances 300a and 300b match for respective pFETs P0, P1. In one embodiment, the outer MC-PC distance has increased from a worst case 70 nm to 114 nm, and the inner MC-PC distance for pFETs has increased from 70 nm to 79 nm. Moreover, the RX regions has been enlarged at where each of the MC regions 230, 330 cross. The enlargement of the RX areas at the cross-section with the MC results in improved contact area for the devices, which renders the devices less sensitive to current degradations. Further, as shown in FIG. 6 at locations labeled "c" in FIG. 6, unnecessary RX "cut-outs" or concave corners have been removed from the RX islands which decreases the likelihood of forming dislocations.

Figure 7:
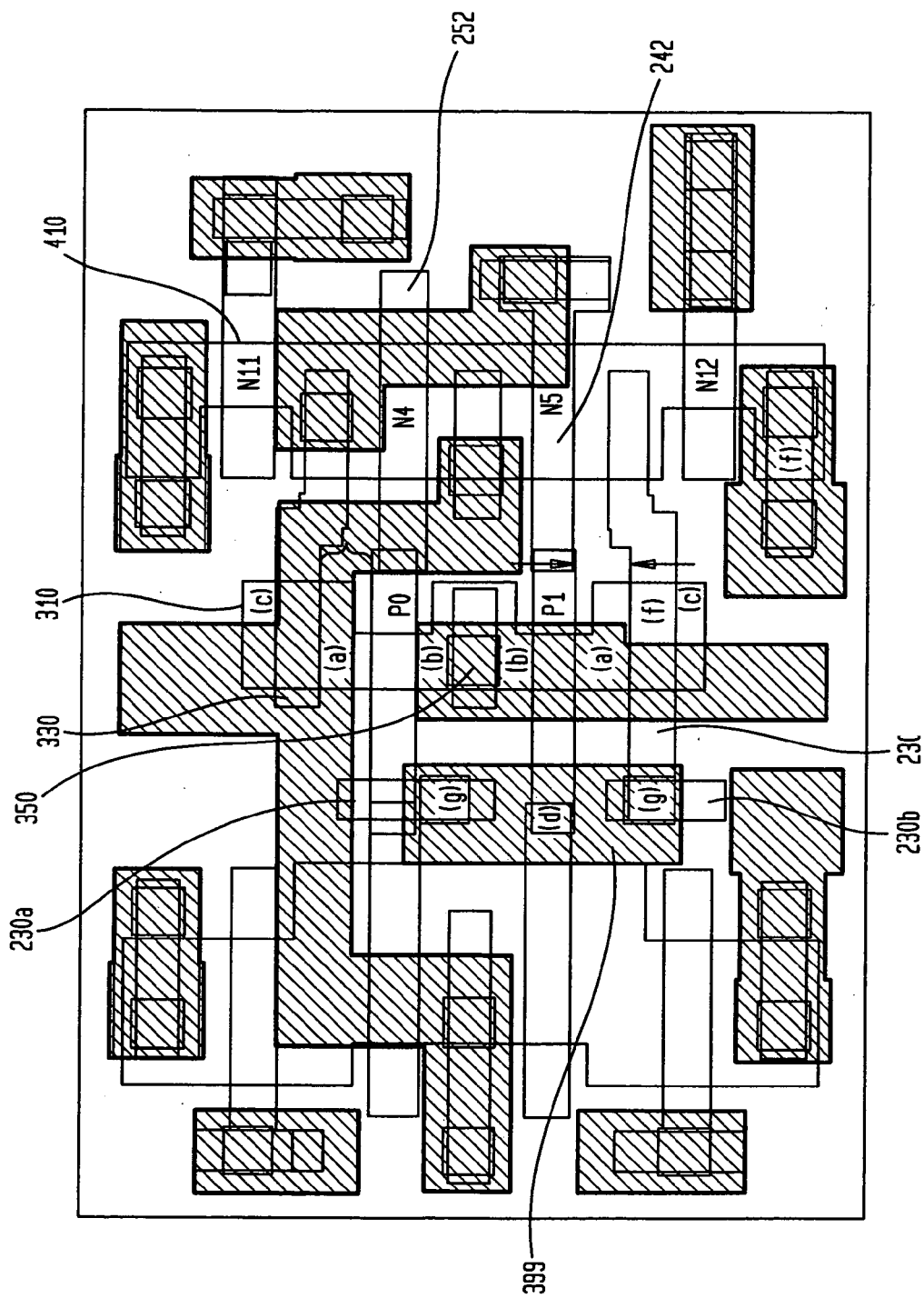
FIG. 7 depicts a schematic and layout capture of the D-cache SRAM cell design of FIG. 6 and includes the M1 metallization layer; and, FIG. 8 depicts a schematic and layout capture of the D-cache SRAM cell design according to an alternative embodiment of the invention shown in FIG. 6.

Further as shown at location labeled "d" in FIG. 6, it is the case that processing now renders the cross-coupling through MC-CA-M1-CA-MC on both the WBL (true) and $\overline{\text{WBL}}$ (complement) side. As shown in the prior art embodiments depicted in FIGS. 2(a) and 2(b), what was the short arm of the L-shaped MC metallization 23 now has been broken into additional separate MC regions 230a, 230b in FIG. 6. Then, CA contact regions of Copper or Tungsten (or alloys thereof) labeled "g" in FIG. 6, are formed at each MC region 230a,b. As shown in FIG. 7, an M1 metallization layer 399 forming a bridge, connects each of the contact vias "g" so that cross-coupling on the true and complement sides are each propagated all the way up to M1 for symmetry purposes. This ensures no remnant charging exists in the finished wafer.

Figure 2A:
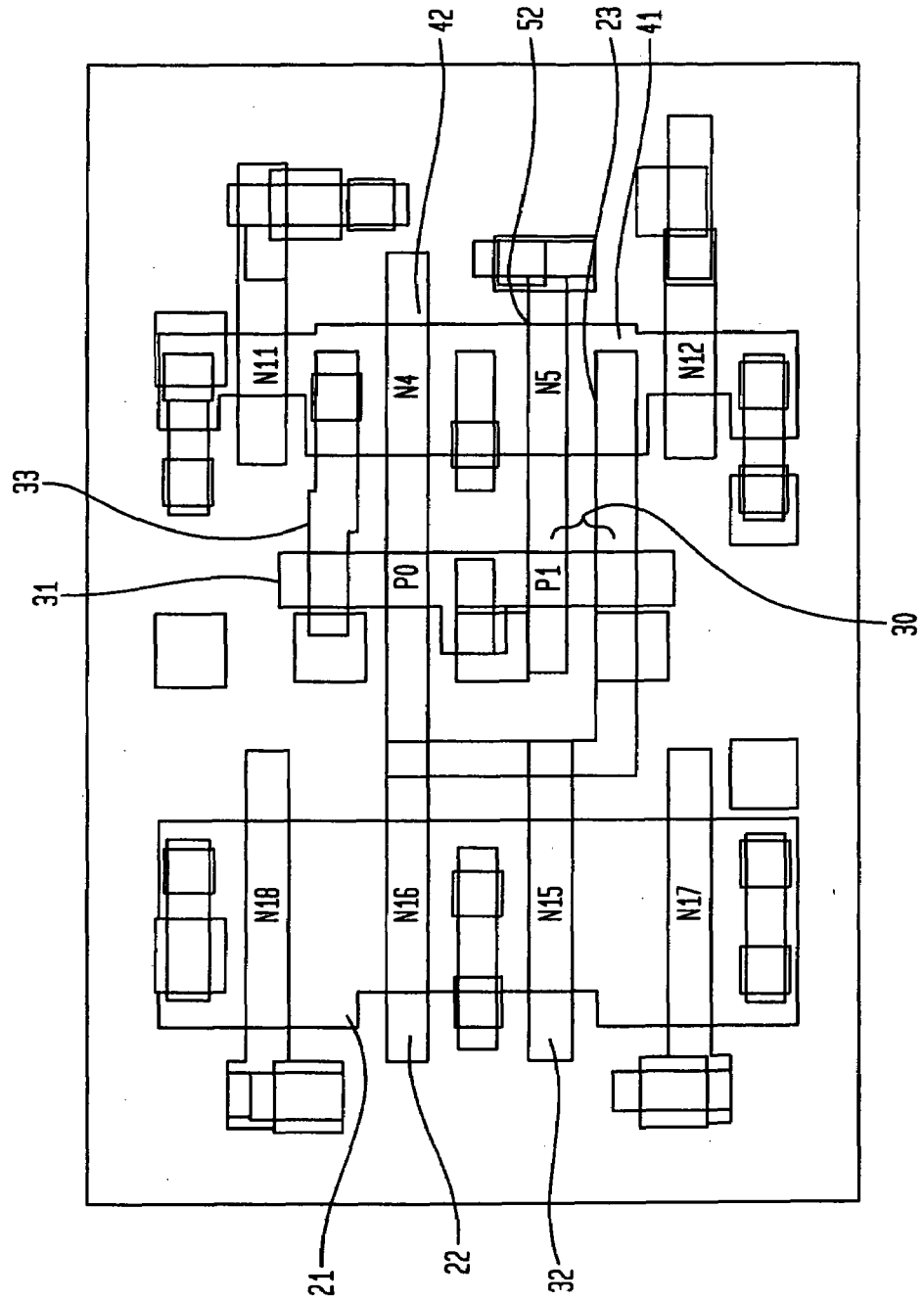
FIGS. 2(a) and 2(b) depict the additionally asymmetries that exist in the physical cell layout of the D-cache SRAM circuit design 10 depicted in the circuit schematic of FIG. 1.
Figure 2B:
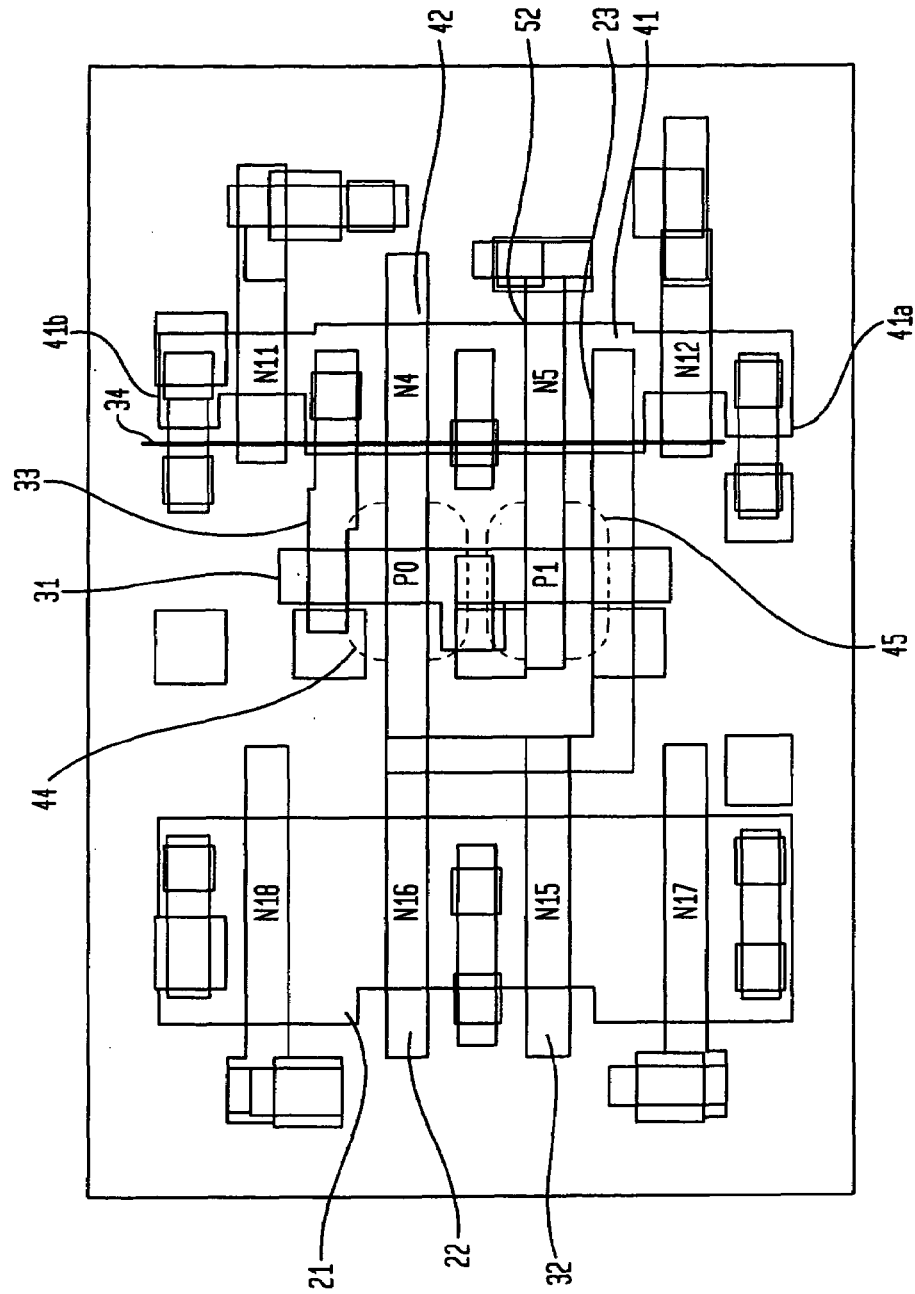
Figure 3:
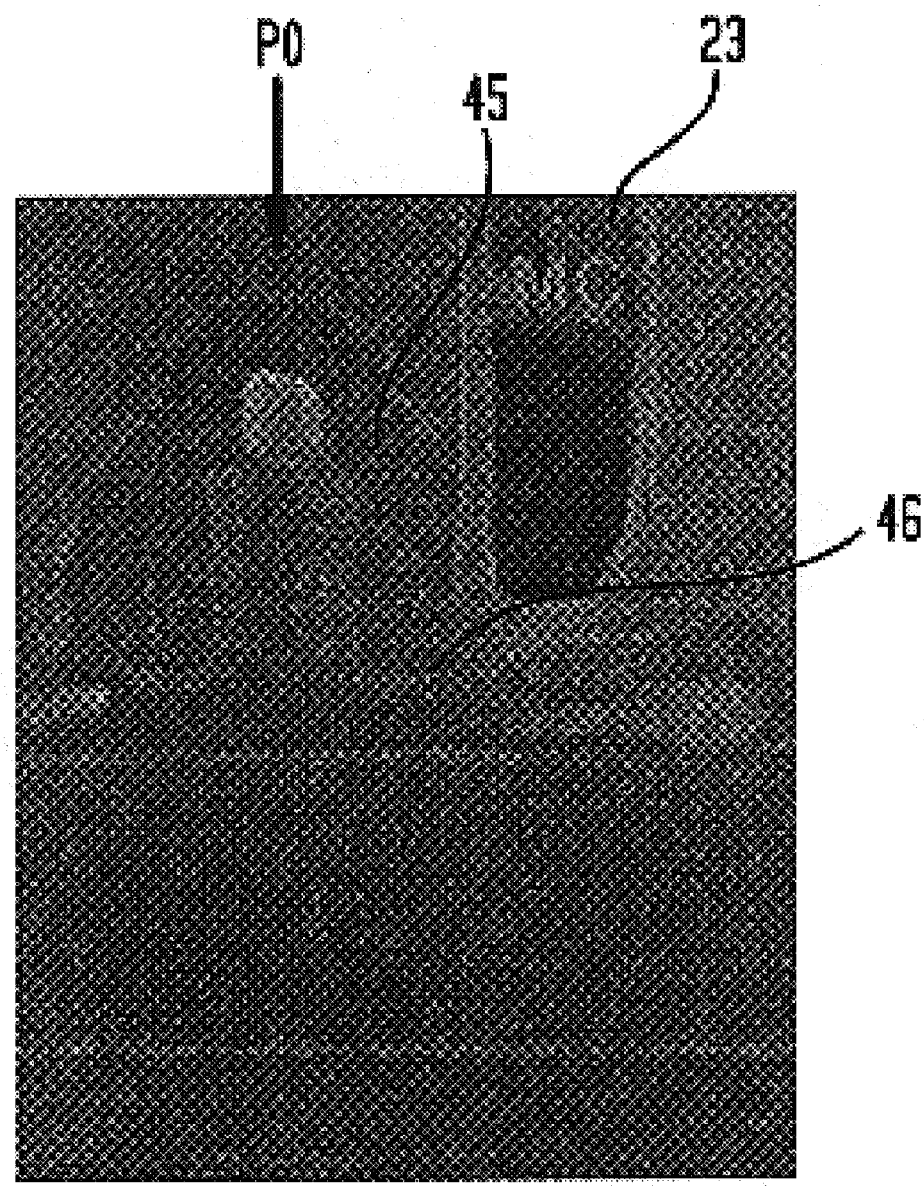
FIG. 3 depicts the pFET structure P1, through a cross-sectional view, including the MC depicted as encroaching a spacer structure 45.
Figure 4:
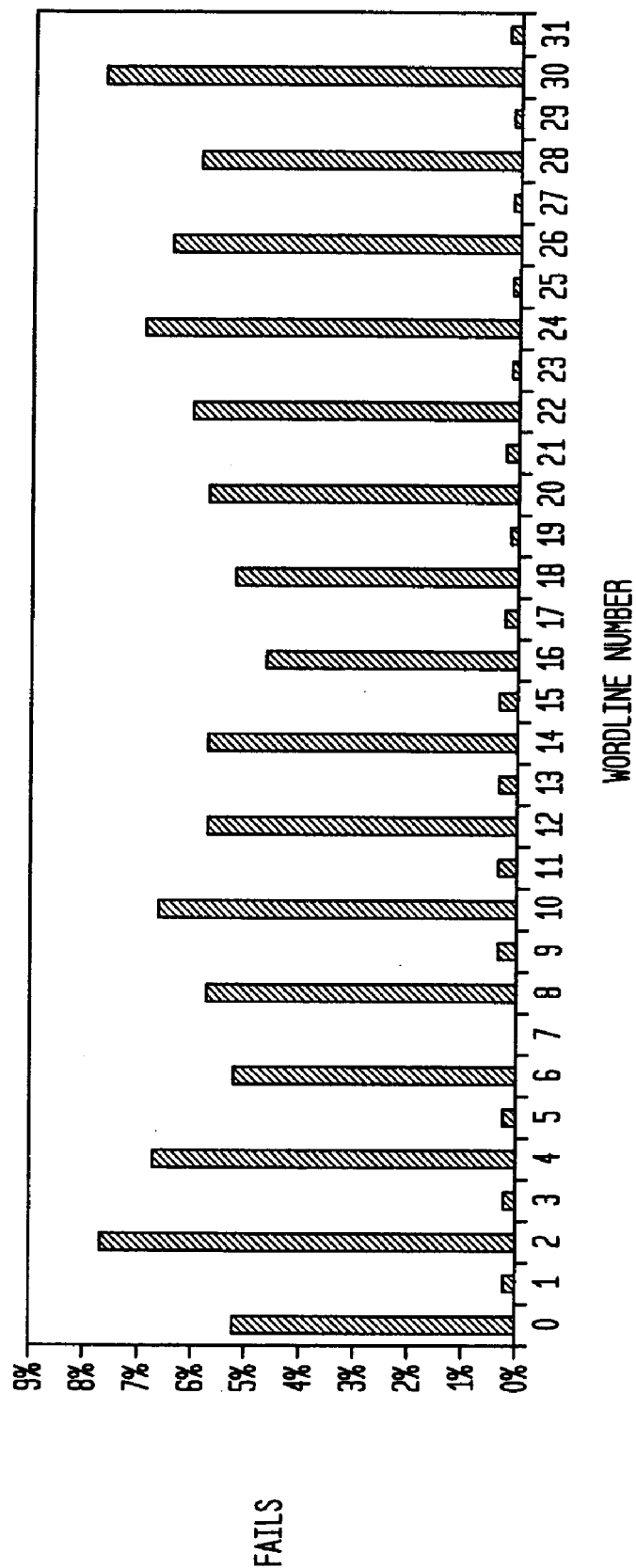
FIG. 4 depicts the performance of wordlines, embodied as pFET structure of FIG. 3, that includes the P1 transistor and illustrates a substantial number of high percent fails occurs on those wordlines.

Referring back to FIG. 6, the PC conductor region 242 through P1 has been extended horizontally as compared to the PC 52 depicted in prior art embodiment of FIGS. 2(a) and 2(b). This results in the ability to fabricate the second read port at the complement side (e.g., FIG. 5) thereby improving the symmetry of the SRAM cell layout. As a result the second read port is separated enabling a data read at each of the true and complement sides. In one embodiment, an inverter device may be provisioned in order to read out data at the complement side. Thus, although asymmetry is eliminated in the modified design, there is a compromise with respect to efficiency since an additional inverter is required, as the readout becomes inverted (i.e., a read port on complement side and this needs to be converted to true).

Further as shown at locations labeled "f" in FIG. 6, it is the case that contact areas of MC landing on RX are equalized and maximized. That is, the contact asymmetry existing as depicted by a line 34 in FIGS. 2(a) and 2(b) have been eliminated thereby improving overall symmetry of the SRAM cell.

Furthermore, as depicted in FIG. 6, every formed MC region is contacted with CA-M1 (reduced charging during plasma processing). That is, M1 is provided for cross-coupling and ridding of any MC that do not have CA landing on top of them. Thus, all of MC regions will be subject to the plasma processing coming from the CA contact being open thus preventing any asymmetric charging for the devices that would result.

Figure 8:
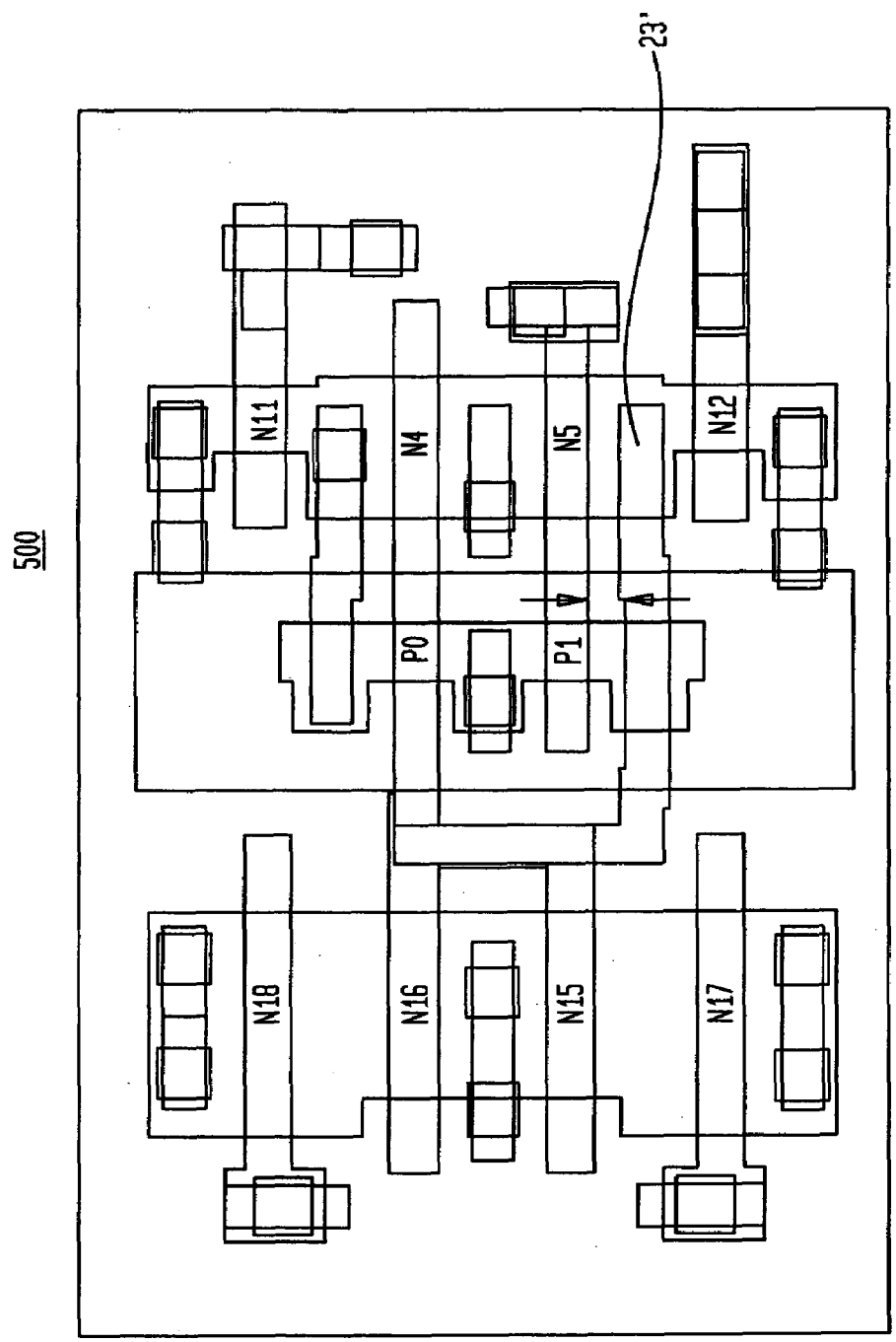

FIG. 8 depicts a schematic and layout capture of the D-cache SRAM cell design 500 according to an alternative embodiment of the invention. This D-cache SRAM cell design 500 comprises a subset of the improvements depicted in the embodiments depicted in the SRAM cell design 100 of FIG. 6. For example, the MC-PC distance at P1 adjusted to 79 nm (same as P0, symmetrical, but not quite as much as in the embodiment depicted in FIG. 6; the MC-RX landing pads have been enlarged and provide more symmetry, but not quite as much symmetry as in the embodiment depicted in FIG. 6. It is noted also that the direction of the extended MC-RX landing pads are in the opposite direction than the embodiment depicted in FIG. 6. Further, the MC local interconnect 23' retains its L-shape structure as in the prior art structure, however, has the bend or jog that effectively spaces out the MC-PC distance, as indicated at the arrows, in accordance with the invention.

While this invention has been particularly shown and described with respect to preferred embodiments thereof, it will be understood by those skilled in the art that the foregoing and other changes in form and detail may be made without departing from the spirit and scope of the present invention. It is therefore intended that the present invention not be limited to the exact forms described and illustrated, but fall within the scope of the appended claims.

What is claimed is:

1. A SRAM cell comprising:
    first and second cross-coupled inverter devices;
    a bit line connected to the first of said cross-coupled inverter devices through a first access transistor, and a complement bit line connected to the second of said cross-coupled inverter devices through a second access transistor; and,
    first read port means connected at an internal node of said first of said cross-coupled inverter devices enabling read access to said bitline, and, second read port means connected at an internal node of said second said cross-coupled inverter devices enabling read access to said complement bid me,
    wherein said first cross-coupled inverter device includes a first pull-up pFET transistor device comprising a gate conductor structure and a drain or source region upon which a first conductive interconnect layer is formed in a semiconductor structure, and said second cross-coupled inverter device includes a second pull-up pFET transistor device comprising a gate conductor structure and a drain or source region upon which a second conductive interconnect layer is formed in said semiconductor structure, wherein a distance between said gate conductor structure of said first pull-up pFET transistor device and said first conductive interconnect layer is substantially equal to the distance between said gate conductor structure of said second pull-up pFET transistor device and said second conductive interconnect layer thereby increasing symmetry between the first and the second cross-coupled inverter devices to improve SRAM cell performance.

2. The SRAM cell as claimed in claim 1, wherein said distance between said gate conductor of said first pull-up pFET transistor device and said first conductive interconnect layer and, said distance between said gate conductor of said second pull-up pFET transistor device and said second conductive interconnect layer is maximized.

3. The SRAM cell as claimed in claim 1, wherein cross-coupling of said first cross-coupled inverter devices comprises a connection formed at said first conductive interconnect layer through a first via connection to a metal structure formed at a metallization level above said first conductive interconnect layer and from said metal structure formed at a metallization level down through a second via connection connecting said gate conductor structure of said second pull-up pFET transistor device.

4. The SRAM cell as claimed in claim 1, wherein cross-coupling of said second cross-coupled inverter devices comprises a connection formed at said second conductive interconnect layer through a first via connection to a metal structure formed at a metallization level above said second conductive interconnect layer and from said metal structure formed at a metallization level down through a second via connection connecting said gate conductor structure of said first pull-up pFET transistor device.

5. A 6T-SRAM cell structure comprising:
    a substrate; and,
    a device configuration comprising two pull-down nFET transistor devices and two pull-up pFET transistor devices located on the substrate, a first pair comprising a pull-down nFET transistor device and pull-up pFET transistor device comprising a first inverter device, and a second pair comprising a pull-down nFET transistor device and pull-up pFET transistor device comprising a second inverter device, said first and second inverter devices in a cross-coupled configuration and defining a respective true bitline node and complement bitline node,
    first read port means connected at a true bitline node for enabling read access to a bitline data; and,
    second read port means connected at a complement bitline node for enabling read access to complementary bitline data;
    wherein said first pull-up pFET transistor device comprises a gate conductor structure and a drain or source region upon which a first conductive interconnect layer is formed in said substrate, and said second pull-up pFET transistor device comprises a gate conductor structure and a drain or source region upon which a second conductive interconnect layer is formed in said substrate, wherein a distance between said gate conductor structure of said first pull-up pFET transistor device and said first conductive interconnect layer is substantially equal to the distance between said gate conductor structure of said second pull-up pFET transistor device and said second conductive interconnect layer, thereby increasing symmetry between the first and the second inverter devices to thereby improve 6T-SRAM cell performance.

6. The 6T-SRAM cell as claimed in claim 5, wherein said distance between said gate conductor of said first pull-up pFET transistor device and said first conductive interconnect layer and, said distance between said gate conductor of said second pull-up pFET transistor device and said second conductive interconnect layer is maximized.

7. The 6T-SRAM cell as claimed in claim 5, wherein cross-coupling of said first inverter device comprises a connection formed at said first conductive interconnect layer through a first via connection to a metal structure formed at a metallization level above said first conductive interconnect layer and from said metal structure formed at a metallization level down through a second via connection connecting said gate conductor structure of said second pull-up pFET transistor device.

8. The 6T-SRAM cell as claimed in claim 5, wherein cross-coupling of said second inverter devices comprises a connection formed at said second conductive interconnect layer through a first via connection to a metal structure formed at a metallization level above said second conductive interconnect layer and from said metal structure formed at a metallization level down through a second via connection connecting said gate conductor structure of said first pull-up pFET transistor device.

9. The 6T-SRAM cell as claimed in claim 5, wherein said substrate comprises SOI regions, and either said two pull-down nFET transistor devices or said two pull-up pFET transistor devices are located on the SOI regions.

10. The 6T-SRAM cell as claimed in claim 5, wherein said substrate comprises SOI regions, and both said two pull-down nFET transistor devices and said two pull-up pFET transistor devices are located on the SOI regions.

11. A D-cache memory device as comprising:

first and second cross-coupled inverter devices defining a respective true bitline node and complement bitline node, said first cross-coupled inverter device including a first pull-up pFET transistor device comprising a gate conductor structure and a drain or source region upon which a first conductive interconnect layer is formed in a semiconductor structure, and said second cross-coupled inverter device includes a second pull-up pFET transistor device comprising a gate conductor structure and a drain or source region upon which a second conductive interconnect layer is formed in said semiconductor structure, wherein a distance between said gate conductor structure of said first pull-up pFET transistor device and said first conductive interconnect layer is substantially equal to the distance between said gate conductor structure of said second pull-up pFET transistor device and said second conductive interconnect layer, thereby increasing symmetry between the first and the second cross-coupled inverter devices to thereby improve D-cache memory performance, wherein said distance between said gate conductor of said first pull-up pFET transistor device and said first conductive interconnect layer and, said distance between said gate conductor of said second pull-up pFET transistor device and said second conductive interconnect layer is maximized.

12. The D-cache memory device as claimed in claim 11, wherein cross-coupling of said first cross-coupled inverter devices comprises a connection formed at said first conductive interconnect layer through a first via connection to a metal structure formed at a metallization level above said first conductive interconnect layer and from said metal structure formed at a metallization level down through a second via connection connecting said gate conductor structure of said second pull-up pFET transistor device.

13. The D-cache memory device as claimed in claim 11, wherein cross-coupling of said second cross-coupled inverter devices comprises a connection formed at said second conductive interconnect layer through a first via connection to a metal structure formed at a metallization level above said second conductive interconnect layer and from said metal structure formed at a metallization level down trough a second via connection connecting said gate conductor structure of said first pull-up pFET transistor device.

14. The D-cache memory device as claimed in claim 11, further including:

a bit line coupled to said true bitline node of said first cross-coupled inverter device through a first access transistor; and, a complement bit line coupled to said complement bitline node of said second cross-coupled inverter device trough a second access transistor.

* * * * *